US011693995B2

(12) United States Patent
Krabbe et al.

(10) Patent No.: US 11,693,995 B2
(45) Date of Patent: Jul. 4, 2023

(54) METHOD AND SYSTEM TO PROVIDE AN INDIVIDUALIZED FOOTWEAR

(71) Applicant: adidas AG, Herzogenaurach (DE)

(72) Inventors: Berthold Krabbe, Scheinfeld (DE); Christoph G. Berger, Ebermannstadt (DE); Harald Körger, Scheinfeld (DE); Matthias Schneider, Fuerth (DE); Jannik Simon Kögel, Erlangen (DE)

(73) Assignee: adidas AG, Herzogenaurach (DE)

( * ) Notice: Subject to any disclaimer, the term of this patent is extended or adjusted under 35 U.S.C. 154(b) by 0 days.

(21) Appl. No.: 17/475,016

(22) Filed: Sep. 14, 2021

(65) Prior Publication Data

US 2022/0083701 A1    Mar. 17, 2022

(30) Foreign Application Priority Data

Sep. 16, 2020 (DE) .......................... 102020211599.0

(51) Int. Cl.
*G06F 30/10* (2020.01)
*A43D 1/02* (2006.01)

(52) U.S. Cl.
CPC .............. *G06F 30/10* (2020.01); *A43D 1/02* (2013.01)

(58) Field of Classification Search
CPC .......... G06F 30/10; G06F 30/00; G06F 30/17; G06F 30/18; A43D 1/02; A43D 2200/60
USPC ............................................................ 703/1
See application file for complete search history.

(56) References Cited

U.S. PATENT DOCUMENTS

| 2007/0043582 | A1* | 2/2007 | Peveto ................. A43B 23/027 705/26.1 |
| 2009/0234489 | A1* | 9/2009 | Healy .................... G06Q 30/02 700/130 |
| 2016/0016041 | A1* | 1/2016 | Giedwoyn ............. G16H 20/30 700/91 |
| 2017/0245586 | A1* | 8/2017 | Cook ..................... A43B 13/18 |
| 2019/0223797 | A1  | 7/2019 | Tran et al. |
| 2019/0261735 | A1* | 8/2019 | Wawrousek ........... B29C 44/08 |
| 2020/0275742 | A1* | 9/2020 | Kim ....................... A43D 1/027 |

(Continued)

FOREIGN PATENT DOCUMENTS

WO    2018206986    11/2018

OTHER PUBLICATIONS

European Application No. 21196888.8, Extended European Search Report dated Feb. 7, 2022, 8 pages.

(Continued)

*Primary Examiner* — Rehana Perveen
*Assistant Examiner* — Troy A Maust
(74) *Attorney, Agent, or Firm* — Kilpatrick Townsend & Stockton LLP

(57) ABSTRACT

The present invention relates to a method of providing an individualized footwear for a user, operated in a computerized calculation system, the method comprising: obtaining one or more input data relating to the user, allocating the one or more input data to a plurality of attributes relevant to an individualized footwear, each of the attributes being associated with the one or more input data, calculating a parameter for each of the attributes using the one or more input data associated thereto, and providing individualized construction data for manufacture of the individualized footwear based on the calculated parameters of the attributes.

21 Claims, 1 Drawing Sheet

(56) References Cited

U.S. PATENT DOCUMENTS

2022/0183424 A1* 6/2022 Nevala .................. A43D 1/025

OTHER PUBLICATIONS

German Patent Application No. 102020211599.0, Office Action dated Apr. 13, 2021, 13 pages (English machine translation provided).

* cited by examiner

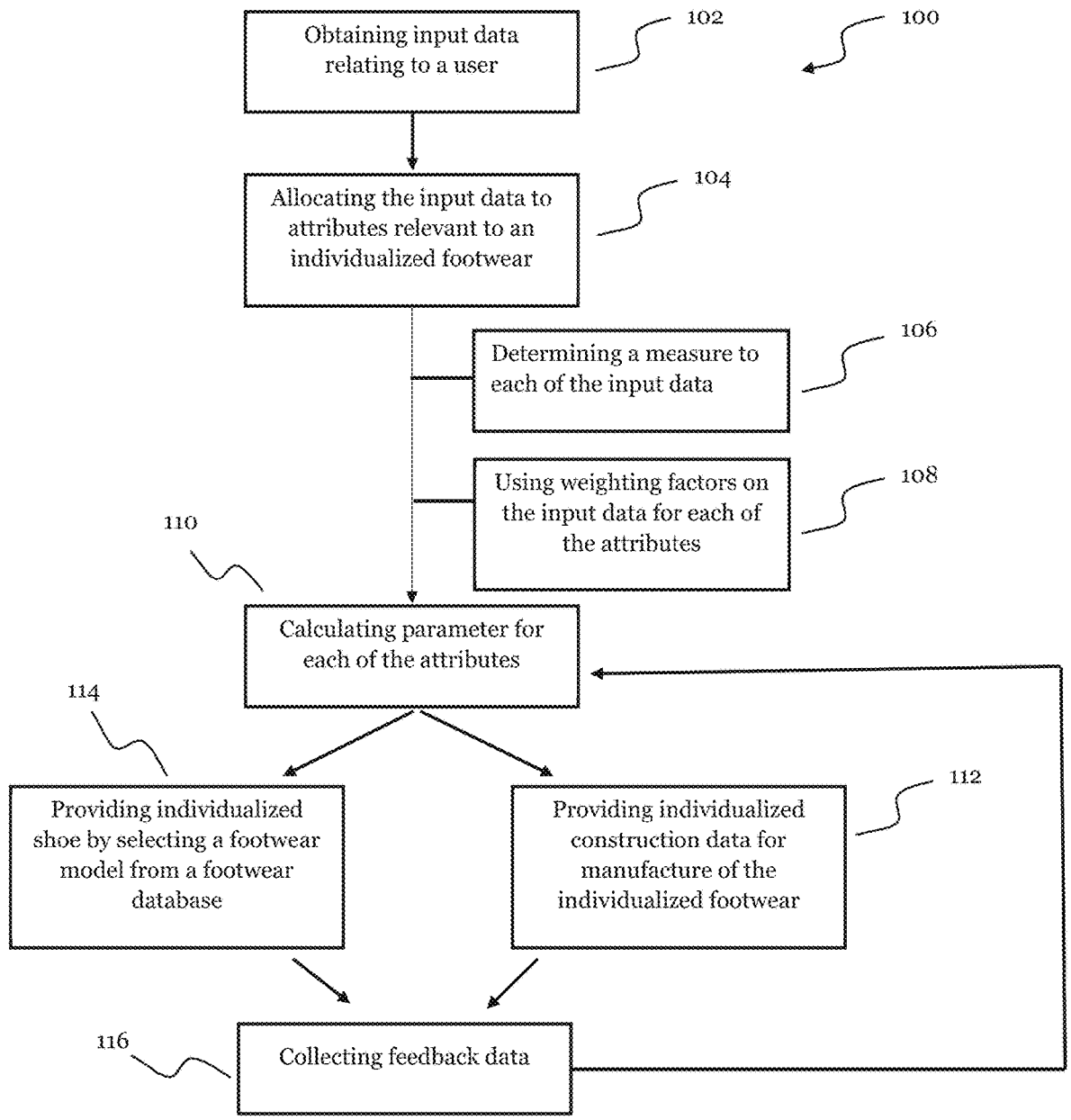

METHOD AND SYSTEM TO PROVIDE AN INDIVIDUALIZED FOOTWEAR

CROSS REFERENCE TO RELATED APPLICATION

This application is related to and claims priority benefits from German Patent Application No. 102020211599.0, filed on Sep. 16, 2020, entitled METHOD AND SYSTEM TO PROVIDE AN INDIVIDUALIZED FOOTWEAR ("the '599 application"). The '599 application is hereby incorporated herein in its entirety by this reference.

FIELD OF THE INVENTION

The present invention relates to a method of providing an individualized footwear, as well as to a corresponding system for providing an individualized footwear. Furthermore, the present invention relates to an individualized footwear, in particular a sports shoe, provided by such a method or system.

BACKGROUND

Nowadays footwear articles are conventionally produced in large quantities of identical products, e.g. by mass production based on standardized values. This kind of production is extremely efficient and results in an immediate and inexpensive access of customers to the footwear articles. It also allows to provide a wide variety of footwear adapted for specific sports activities.

However, it remains a challenge for customers and especially athletes to find an optimally fitting shoe. It costs a shoe wearer a lot of effort to find the correct and optimal pair of shoes. Even if an optimal fit could be found for one foot, this does not guarantee the same for the other foot as a human's body is not exactly mirror symmetric.

Moreover, a shoe may also have to fulfil a specific function, for example sports shoes such as soccer shoes. A wearer often must make a compromise between functional demand and wearing comfort, such as an athlete often gives priority to the functions and thus has to accept a pair of shoes with imperfect fitting. This may in the end reduce the performance of the athlete and even increase the athlete's risk of injury. For example, sudden changes of direction or lateral jumps during exercise can lead to forces acting on the joints of an athlete, which may exceed a multiplicity of the bodyweight of the athlete and result in an injury.

In theory, the above-mentioned problems can be addressed relying on a qualified and experienced shoemaker to produce an individualized shoe. However, as it is a manual procedure, the production by a shoemaker would result in cost- and time-intensive product which is not a favorable option for the majority of population. Furthermore, a shoemaker cannot be an expert in every field of sports and might lack the comprehensive orthopedic knowledge to provide an ideal shoe for a specific athlete.

The present invention is therefore based on the above problem and designed to provide a method and a system for improving the provision of an individualized footwear in order to at least partly overcome the above outlined disadvantages.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

One example of the present disclosure includes a method of providing individualized footwear for a user. The method is implemented on a computer, such as a computerized calculation system. The method includes obtaining one or more input data relating to the user. The method also includes allocating the one or more input data to a plurality of attributes relevant to an individualized footwear. Each of the attributes can be associated with the one or more input data. The method further includes calculating a parameter for each of the attributes using the one or more input data associated thereto. The method can then include providing individualized construction data for manufacture of the individualized footwear based on the calculated parameters of the attributes, or providing the individualized footwear by selecting a footwear model from a footwear database based on the calculated parameters of the attributes.

In some examples, the one or more input data comprise one or more of anthropometric data of the user, biomechanical data of the user, and personal preference of the user for a footwear. The personal preference of the user for the footwear may comprise toe allowance, fit perception, and traction preference.

According to some examples, the anthropometric data of the user comprises body mass of the user and foot length, ball width, ball angle, ball circumference, waist circumference, instep circumference, heel circumference, heel shape, arch index and midfoot width of the foot of the user.

In some examples, the biomechanical data of the user comprises playing style, motion analysis and skill level of the user, and plantar pressure, ankle instability, average lateral excursion and foot sensitivity of the foot of the user, and environmental data such as a surface type that contacts the footwear. The surface type may be an artificial grass.

In certain aspects, the one or more input data can be obtained by at least one of the methods of 3D foot scan, pressure plate and/or treadmill analysis, force plate analysis, lateral jump analysis, sprint analysis, and questionnaire.

In some examples, the method further comprises determining a measure to each of the one or more input data relating to the user.

In various examples, the method further comprises, for each of the attributes, using weighting factors on the one or more input data associated thereto to calculate the parameter of the attributes.

According to some examples, the individualized construction data comprises construction data for manufacture of a last and/or a sole and/or an upper of the individualized footwear. The construction data for manufacture of a sole of the individualized footwear may comprise at least one of shape of the sole, stiffness of the sole, rip height of the sole, material of the sole, shape and/or amount and/or distribution of studs on the sole. The construction data for manufacture of an upper of the individualized footwear may comprise at least one of material of the upper, patches of the upper and stitching patterns of the upper.

In certain aspects, the method further comprises collecting feedback data from a plurality of users. The feedback data can be provided with at least one sensor attached to the individualized footwear.

In some examples, the individualized footwear is a sports shoe comprising a soccer shoe.

Another example of the present disclosure can include a system of providing an individualized footwear for a user. The system includes a processor and a non-transitory computer-readable medium comprising program code that is executable by the processor for causing the processor to perform one or more operations. The operations can include obtaining one or more input data relating to a user. The operations can include allocating one or more input data to a plurality of attributes relevant to an individualized footwear. Each of the attributes may be associated with the one or more of the input data. The operations can include calculating a parameter for each of the attributes using the one or more input data associated thereto. The operations can include providing individualized construction data for manufacture of the individualized footwear based on the calculated parameters of the attributes, or for providing the individualized footwear by selecting a footwear model from a footwear database based on the calculated parameters of the attributes.

Yet another example of the present disclosure includes a non-transitory computer-readable medium comprising program code that is executable by a processor for causing the processor to perform one or more operations. The operations can include obtaining one or more input data relating to a user. The operations can include allocating one or more input data to a plurality of attributes relevant to an individualized footwear. Each of the attributes may be associated with the one or more of the input data. The operations can include calculating a parameter for each of the attributes using the one or more input data associated thereto. The operations can include providing individualized construction data for manufacture of the individualized footwear based on the calculated parameters of the attributes, or for providing the individualized footwear by selecting a footwear model from a footwear database based on the calculated parameters of the attributes.

Still another example of the present disclosure includes a sport shoe manufactured using any of the techniques described above.

Various implementations described in the present disclosure can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

Possible embodiments of the present invention are further described in the following detailed description, with reference to the following figures:

FIG. 1 shows an example of a method of providing an individualized footwear according to the present invention.

BRIEF DESCRIPTION

In an embodiment of the present invention, the above-mentioned problem is solved by a method of providing an individualized footwear for a user, in particular a sports shoe for an athlete. The method comprises the following steps: obtaining one or more input data relating to the user; allocating the one or more input data to a plurality of attributes relevant to an individualized footwear, each of the attributes being associated with the one or more of the input data; calculating a parameter for each of the attributes using the one or more input data associated thereto; providing individualized construction data for manufacture of the individualized footwear based on the calculated parameters of the attributes, or providing the individualized footwear by selecting a footwear model from a footwear database based on the calculated parameters of the attributes.

The invention provides a precise instruction for obtaining an individualized footwear such that its manufacture or selection time can be dramatically decreased. In particular, the described method offers significant time- and costs-savings compared to an individual production by a shoemaker and provides more precise and reproducible results of an individualized footwear. In particular, the described method is able to analyze an abundant amount of one or more input data relating to a specific person, such as anatomical characteristics, personal preference and requirements, etc., and thus can determine an optimal combination of a variety of possible technical features of a footwear, which can accordingly provide the greatest benefit for the respective person.

The input data relating to a user may comprise one or more of anthropometric data of the user, biomechanical data of the user, and personal preference of the user for a footwear.

The anthropometric data of the user may comprise at least one of the following data: body mass of the user, foot length, ball width, ball angle, ball circumference, waist circumference, instep circumference, heel circumference, heel shape, arch index, and midfoot width of the foot of the user. Based on the anthropometric data, the method of the present invention is capable of providing an individualized footwear with an optimal fit and comfort for the user.

The biomechanical data of the user may comprise at least one of the following data: playing style, motion analysis and skill level of the user, and plantar pressure, ankle instability, average lateral excursion, and foot sensitivity of the foot of the user, and environmental data such as a surface type that contacts the footwear.

By taking into consideration the biomechanical data together with other well-known techniques for analyzing a dynamic structure such as finite-element-modeling, it allows to forecast dynamic properties of the individualized shoe to be manufactured or selected.

The surface type of the environmental data may comprise artificial grass, natural grass or concrete surfaces. For an athlete, the friction between the sports shoe and the ground surface plays an important role for controlling movement. A desired friction can be realized by a specific shape and material of an outsole of the sports shoe, be it to increase the friction or to reduce the friction on the surface on which the shoe is to be used. For example, for a soccer shoe, the studs on the outsole of the soccer shoe can influence the performance of a soccer player, e.g. by providing an optimal grip between the soccer shoe and an artificial grass ground.

The personal preference of the user for a footwear may comprise at least one of the following data: toe allowance, fit perception and traction preference. Not only can objective scientific data be taken into account for the provision of the individualized footwear according to the method of the present invention, subjective personal preferences can be taken into consideration such that an optimal and customized individualized shoe can be provided.

The one or more input data relating to the user may be obtained by at least one of the following methods: 3D foot scan, pressure plate such as static or dynamic plantar pressure analysis, treadmill analysis, force plate analysis, lateral jump analysis, sprint analysis, body weight measurement, and questionnaire such as for fit perception and foot sensitivity.

All of these methods can provide valuable input data to be used for the provision of individualized footwear in the method of the present invention. For example, 3D foot scans allow for the generation of a concrete and precise prediction of the shape of footwear. Measurements by pressure plate analysis can be used to create an individualized sole and to determine the required cushioning.

The method of providing an individualized footwear may further comprise determination of a measure to each of the obtained one or more input data relating to the user. The way to determine the measure can be based on professional knowledge and experience of experts, or alternatively by a computer-based algorithm, which collects and analyzes relevant data.

One exemplary way to determine the measure for a specific input data may be to classify the specific input data into several levels or categories first and assign the input data from a specific user into one of the levels or categories. In other words, the input data relating to a specific user may be compared to other users.

The method of providing an individualized footwear may further comprise, for each of the attributes, using weighting factors on the one or more input data associated thereto to calculate the parameter of the attributes. The weighing factors allow the possibility to select certain input data as having a greater impact than other input data, for a specific contribution relevant to the individualized footwear.

The individualized construction data may comprise construction data for manufacture of a last and/or sole and/or an upper of the individualized footwear.

The construction data for manufacture of a sole of the individualized footwear may comprise at least one of the following data: shape of the sole, stiffness of the sole, rip height of the sole, material of the sole, shape and/or amount and/or distribution of studs on the sole.

Depending on the surface on which the shoe is to be used, the construction data can comprise a specific rip height as well as a robustness of the footwear to environmental influences. In addition, the construction data can comprise a shoe sole with a stiffness gradient, which are adapted to compensate deviations of the anatomy of the wearer compared to standard values. Therefore, the risk of injuries can be significantly reduced.

The construction data for manufacture of an upper of the individualized footwear may comprise at least one of the following data: material of the upper, patches of the upper, and stitching patterns of the upper. The construction data for the upper can address the requirements of optimal fitting, necessary functions and preferred comfort of the footwear for the user, and thus provide an optimal individualized footwear.

In an embodiment, the method of providing an individualized footwear may further comprise collecting feedback data from a plurality of users, which are preferably provided with at least one sensor attached to the individualized footwear.

In an embodiment, the method of providing an individualized footwear may comprise use of an artificial intelligence algorithm trained on the basis of available input data relating to several users, parameters of attributes relevant to several individualized footwear, and individualized construction data and/or selected footwear models as reference. Such an algorithm is, after sufficient training, far superior to any human shoemaker as future construction data or selection output are then based on the collected experience of a potentially unlimited number of earlier constructions and selections. To this end, the artificial intelligence algorithm may involve feedback data from a plurality of users. Such feedback can be manually recorded but is preferably provided by at least one sensor attached to the individualized footwear to provide an efficient and possibly automatic training of the artificial intelligence algorithm.

In one embodiment, the individualized footwear is a sports shoe comprising a soccer shoe.

According to the method of providing an individualized footwear of the present invention, an optimal footwear for a specific user, e.g. an optimal soccer shoe for a soccer athlete, can be identified and manufactured, especially based on input data relating to the user including personal preference and functional needs.

The present invention also relates to a system for implementing any of the above-described methods. Such a system can be provided by suitable hardware and software and enables a manufacture or distributor of footwear to efficiently provide highly individualized footwear. Finally, the present invention relates to a sport shoe manufactured by a method according to one of the above-described methods.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Possible embodiments of the present invention will be described below primarily with reference to an individualized sports shoe, such as for soccer, basketball, American football, rugby, baseball, snowboard, running, and athletics. It is emphasized that the present invention is not limited by this embodiment. For example, other examples may relate to other types of shoes, for example any type of leisure shoe such as sneakers, slippers, moccasins, etc.

Moreover, for brevity only a limited number of embodiments are described in the following. However, the skilled person will recognize that the specific features described with reference to these embodiments may be modified and combined differently and that certain aspects of the specific embodiments may also be omitted. Moreover, it is noted that the aspects described in the subsequent detailed description may be combined with aspects described in the above summary section.

FIG. 1 shows a method of providing an individualized footwear, for example a soccer shoe, for a user, for example an athlete, according to the present invention.

The method comprises a first step 102 of acquisition of input data relating to an athlete. The input data comprises one or more of anthropometric data of the athlete, biomechanical data of the athlete, personal preference of the athlete for a sports shoe.

A plurality of attributes relevant to the individualized footwear are pre-selected and pre-determined, for example, according to expert's knowledge or a standard manufacture process for an individualized soccer shoe. Table 1 below shows three exemplary attributes closely relevant to an individualized soccer shoe, i.e. forefoot stiffness, midfoot stiffness and traction, which are well-known in the field. Other attributes, for example, functional fit and lateral stability, can be relevant to a soccer shoe.

TABLE 1

| Exemplary Attributes | Exemplary Input Data | Measure of Athlete X | Weighting factor | Calculated parameter |
|---|---|---|---|---|
| Forefoot stiffness | Foot length | ☒ ≥281 mm<br>☐ 251-280 mm<br>☐ ≤250 mm | 3 | ☒ stiff - 0.35 Nm/deg<br>☐ medium - 0.25 Nm/deg<br>☐ compliant - 0.15 Nm/deg |
|  | Body mass | ☒ ≥91<br>☐ 76-90<br>☐ ≤75 | 5 |  |
|  | Playing style | ☒ Speed<br>☐ Control<br>☐ Agility | 3 |  |
|  | Surface type | ☒ Artificial<br>☐ Natural<br>☐ Concrete | 1 |  |
| Midfoot stiffness | Foot length | ☒ ≥281 mm<br>☐ 251-280 mm<br>☐ ≤250 mm | 3 | ☐ stiff - 0.35 Nm/deg<br>☐ medium - 0.25 Nm/deg<br>☐ compliant - 0.15 Nm/deg |
|  | Body mass | ☒ ≥91<br>☐ 76-90<br>☐ ≤75 | 5 |  |
|  | Arch index | ☒ ≥0.30<br>☐ 0.21-0.29<br>☐ ≤0.20 | 1 |  |
|  | Surface type | ☒ Artificial grass<br>☐ Natural grass<br>☐ Hard surface | 1 |  |
| Traction | Body mass | ☒ ≥91<br>☐ 76-90<br>☐ ≤75 | 1 | ☐ . . .<br>☐ . . .<br>☐ . . . |
|  | Playing style | ☒ Speed<br>☐ Control<br>☐ Agility | 1 |  |
|  | Traction preference | ☒ High<br>☐ Medium<br>☐ low | 1 |  |

The anthropometric data of the athlete can be obtained by measuring the body and the foot of the athlete, for example, with a 2D scan or a 3D scan device and method. In addition, fitting into a standardized or modelized shoe can also be used to obtain the subjective feeling and comfort of the athlete. In the embodiment below, foot length, body mass and arch index are used as representative data for the anthropometric data.

The biomechanical data of the athlete can be obtained by analyzing and evaluating the motion of the athlete, especially in a dynamic process. For example, the athlete performs physical exercises under observation and recording. In the embodiment below, playing style is taken as representative data for the biomechanical data. In addition, a surface type is taken as environmental data which is also comprised in the biomechanical data of the athlete.

Personal preference of the athlete for a sports shoe may comprise toe allowance, fit perception, traction preference, etc. In the embodiment below, traction preference is used as a representative.

The plurality of input data is then allocated 104 to the attributes. As shown in the second column of Table 1, a few exemplary input data associated with each respective attribute are provided as an example. One input data, e.g., "Body mass," can be associated to one or more attributes. It should also be understood that each of the attributes can be associated with much more input data which is not shown in the embodiment and Table 1. The number of the input data associated to an attribute can be optionally decided according to different demands.

A parameter for each of the attributes is then calculated 110 using the input data associated thereto. For example, a parameter for the attribute "forefoot stiffness" is calculated using the exemplary four input data associated thereto, i.e. foot length, body mass, playing style and surface type.

To calculate the parameter, the input data obtained from and relating to an athlete is first determined 106 with a measure. For example, as shown in Table 1, for an athlete X and for the attribute "forefoot stiffness", each of the input data is indicated by a corresponding measure. The distribution and the definition of the measure of each of the input data can be manually determined based on professional knowledge and experience, or alternatively determined by a computer-based algorithm which collects and analyzes the same input data from a plurality of athletes or users.

Optionally and preferably, weighting factors are then used 108 on the input data to achieve an optimal calculation of the parameters of the attributes. For example, as shown in Table 1 and for the attribute "forefoot stiffness", each of the four input data is given a weighting factor, which is exemplarily represented by an index number in this embodiment. It should be understood that the weighting factor can also be represented by any other formality.

Based on the chosen input data, the measure of the input data and the given weighting factors of the input data, a parameter for a certain attribute can be calculated 110. For example, for the forefoot stiffness in Table 1, the calculated parameter can be either compliant which equals to 0.15 Nm/deg, medium which equals to 0.25 Nm/deg, or stiff which equals to 0.35 Nm/deg. The parameters are engineering parameters which are used for shoe construction and can be measured by standard measurements.

This calculation step can be iterated for a plurality of pre-selected and pre-determined attributes relevant to an individualized footwear. For example, in the embodiment shown in Table 1, the attributes "forefoot stiffness", "midfoot stiffness" and "traction" are selected for provision of an individualized soccer shoe for Athlete X. For each of the attributes, a parameter is calculated based on the corresponding input data, the measure of the input data, and the weighting factors thereof.

The method according to the present invention provides two options 112, 114 to provide an individualized footwear for a user.

A first option 112 is to provide individualized construction data for manufacture of the individualized footwear based on the calculated parameters of the attributes. The individualized construction data consolidates all the calculated parameters of the pre-determined attributes and can be used for manufacture construction of the footwear. In the embodiment shown in Table 1, the individualized construction data comprises the calculated parameters of forefoot stiffness, midfoot stiffness and traction for the soccer shoe.

The individualized construction data can further comprise parameters of attributes related to one or more components of the individualized footwear, such as an upper, an insole, a midsole, and an outsole thereof. In addition, the individualized construction data can also comprise parameters of attributes related to the manufacture of a footwear, for example, a shoe last used during the manufacture.

A second option 114 is to provide the individualized shoe by selecting a recommended footwear model from a footwear database based on the parameters of the attributes. For this embodiment of providing an individualized soccer shoe for athlete X, the footwear database can comprise sports shoes and/or soccer shoes from various manufacturer, composed of various materials, with various weights or functions, etc.

Referring to FIG. 1, the method of providing an individualized shoe according to the present invention can further comprise collecting 116 feedback from a plurality of users. For example, the feedback can be provided by a sensor attached to the individualized footwear.

The method of providing an individualized footwear according to the present invention can be conducted in a system. The system can comprise: means for obtaining 102 input data relating to a user; means for allocating 104 one or more input data to a plurality of attributes relevant to an individualized footwear, each of the attributes being associated with the one or more of the input data; means for calculating 110 parameter for each of the attributes using the one or more input data associated thereto; means for providing 112 individualized construction data for manufacture of the individualized footwear based on the calculated parameters of the attributes, or for providing 114 the individualized footwear by selecting a footwear model from a footwear database based on the calculated parameters of the attributes.

Furthermore, the system can comprise means for determining 106 a measure to each of the input data relating to the user.

Optionally, the system can further comprise means for using 108 weighting factors on the input data associated to the plurality of attributes.

Optionally, the system can further comprise means for collecting 116 feedback data from a plurality of users.

In addition, the system may also use an artificial intelligence algorithm to consolidate the input data and to calculate the parameters of the attributes based on the input data, the measures of the input data, and the weighting factors of the input data. The artificial intelligence algorithm can be trained by feeding with input data and parameters of attributes and comparing the calculation result with the feedback data.

As a result, the method and system according to the present invention allow to effectively and efficiently process a large number of input data and professional knowledge to manufacture and/or select an ideal and optimal individualized footwear for a user.

In the following, further examples are described to facilitate the understanding of the invention:

Example #1: A method of providing an individualized footwear for a user, operated in a computerized calculation system, the method comprising: obtaining one or more input data relating to the user; allocating the one or more input data to a plurality of attributes relevant to an individualized footwear, each of the attributes being associated with the one or more input data; calculating a parameter for each of the attributes using the one or more input data associated thereto; and providing individualized construction data for manufacture of the individualized footwear based on the calculated parameters of the attributes, or providing the individualized footwear by selecting a footwear model from a footwear database based on the calculated parameters of the attributes.

Example #2: The method of Example #1, wherein the one or more input data comprise one or more of anthropometric data of the user, biomechanical data of the user, and personal preference of the user for a footwear.

Example #3: The method of Example #2, wherein the anthropometric data of the user comprises body mass of the user and foot length, ball width, ball angle, ball circumference, waist circumference, instep circumference, heel circumference, heel shape, arch index and midfoot width of the foot of the user.

Example #4: The method of Example #2, wherein the biomechanical data of the user comprises playing style, motion analysis and skill level of the user, and plantar pressure, ankle instability, average lateral excursion and foot sensitivity of the foot of the user, and environmental data such as a surface type that contacts the footwear.

Example #5: The method of Example #4, wherein the surface type is an artificial grass.

Example #6: The method of Example #2, wherein the personal preference of the user for the footwear comprises toe allowance, fit perception, and traction preference.

Example #7: The method of any of Examples #1-6, wherein the one or more input data are obtained by at least one of the methods of 3D foot scan, pressure plate and/or treadmill analysis, force plate analysis, lateral jump analysis, sprint analysis, and questionnaire.

Example #8: The method of any of Examples #1-7, further comprising determining a measure to each of the one or more input data relating to the user.

Example #9: The method of any of Examples #1-8, further comprising, for each of the attributes, using weighting factors on the one or more input data associated thereto to calculate the parameter of the attributes.

Example #10: The method of any of Examples #1-9, wherein the individualized construction data comprises construction data for manufacture of a last and/or a sole and/or an upper of the individualized footwear.

Example #11: The method of Example #10, wherein the construction data for manufacture of a sole of the individualized footwear comprises at least one of shape of the sole, stiffness of the sole, rip height of the sole, material of the sole, shape and/or amount and/or distribution of studs on the sole.

Example #12: The method of Example #10, wherein the construction data for manufacture of an upper of the individualized footwear comprises at least one of material of the upper, patches of the upper and stitching patterns of the upper.

Example #13: The method of any of Examples #1-12, further comprising collecting feedback data from a plurality of users, which are provided with at least one sensor attached to the individualized footwear.

Example #14: The method of any of Examples #1-13, wherein the individualized footwear is a sports shoe comprising a soccer shoe.

Example #15: A system of providing an individualized footwear for a user, the system comprising: a processor and a non-transitory computer-readable medium including program code that is executable by the processor for causing the processor to perform one or more operations. The operations can include obtaining one or more input data relating to a user. The operations can include allocating one or more input data to a plurality of attributes relevant to an individualized footwear. Each of the attributes may be associated with the one or more of the input data. The operations can include calculating a parameter for each of the attributes using the one or more input data associated thereto. The operations can include providing individualized construction data for manufacture of the individualized footwear based on the calculated parameters of the attributes, or for providing the individualized footwear by selecting a footwear model from a footwear database based on the calculated parameters of the attributes.

Example #16: The system of Example #15, wherein the one or more input data comprise one or more of anthropometric data of the user, biomechanical data of the user, and personal preference of the user for a footwear.

Example #17: The system of Example #16, wherein the anthropometric data of the user comprises body mass of the user and foot length, ball width, ball angle, ball circumference, waist circumference, instep circumference, heel circumference, heel shape, arch index, and midfoot width of the foot of the user.

Example #18: The system of any of Examples #15-17, wherein the one or more input data are obtained by a 3D foot scan, pressure plate and/or treadmill analysis, force plate analysis, lateral jump analysis, sprint analysis, and/or questionnaire.

Example #19: The system of Example #15, wherein the individualized construction data comprises construction data for manufacture of a last and/or a sole and/or an upper of the individualized footwear.

Example #20: The system of any of Examples #15-19, wherein the program code is further executable by the processor for causing the processor to select a footwear model from a footwear database based on the calculated parameters of the attributes.

Example #21: A non-transitory computer-readable medium comprising program code that is executable by the processor for causing the processor to perform one or more operations. The operations can include obtaining one or more input data relating to a user. The operations can include allocating one or more input data to a plurality of attributes relevant to an individualized footwear. Each of the attributes may be associated with the one or more of the input data. The operations can include calculating a parameter for each of the attributes using the one or more input data associated thereto. The operations can include providing individualized construction data for manufacture of the individualized footwear based on the calculated parameters of the attributes, or for providing the individualized footwear by selecting a footwear model from a footwear database based on the calculated parameters of the attributes.

It should be emphasized that the above-described aspects are merely possible examples of implementations, merely set forth for a clear understanding of the principles of the present disclosure. Many variations and modifications can be made to the above-described embodiment(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims that follow, they are used only in a generic and descriptive sense, and not for the purposes of limiting the described invention, nor the claims that follow.

That which is claimed is:

1. A method of providing an individualized footwear for a user, operated in a computerized calculation system, the method comprising:
    obtaining a value for a type of input data relating to the user;
    determining that the type of input data corresponds to at least two attributes of the individualized footwear;
    calculating a parameter for each attribute of the at least two attributes using the value and a respective weight assigned to the type of input data in relation to the attribute, wherein the type of input data is assigned different weights with respect to the at least two attributes, such that the type of input data influences a first parameter for a first attribute more than a second parameter for a second attribute; and
    providing individualized construction data for manufacture of the individualized footwear based on the calculated parameters of the at least two attributes.

2. The method of claim 1, wherein the type of input data comprises anthropometric data of the user, biomechanical data of the user, or personal preference of the user for a footwear.

3. The method of claim 2, wherein the anthropometric data of the user comprises body mass of the user and foot length, ball width, ball angle, ball circumference, waist circumference, instep circumference, heel circumference, heel shape, arch index, and midfoot width of the foot of the user.

4. The method of claim 2, wherein the biomechanical data of the user comprises playing style, motion analysis and skill level of the user, and plantar pressure, ankle instability, average lateral excursion and foot sensitivity of the foot of the user, and environmental data including a surface type that contacts the footwear.

5. The method of claim 4, wherein the surface type is an artificial grass.

6. The method of claim 2, wherein the personal preference of the user for the footwear comprises toe allowance, fit perception, and traction preference.

7. The method of claim 1, wherein the value is obtained by a 3D foot scan, pressure plate and/or treadmill analysis, force plate analysis, lateral jump analysis, sprint analysis, and/or questionnaire.

8. The method of claim 1, further comprising, for each attribute of the attributes:
  determining respective weighting factors to apply to multiple types of input data allocated to the attribute, the respective weighting factors being different from one another; and
  applying the respective weighting factors to each type of input data allocated to the attribute to calculate the parameter of the attribute.

9. The method of claim 1, wherein the individualized construction data comprises construction data for manufacture of a last and/or a sole and/or an upper of the individualized footwear.

10. The method of claim 9, wherein the construction data for manufacture of a sole of the individualized footwear comprises at least one of: a shape of the sole, a stiffness of the sole, a height of the sole, a material of the sole, a shape of studs on the sole, an amount of studs on the sole, or a distribution of studs on the sole.

11. The method of claim 9, wherein the construction data for manufacture of an upper of the individualized footwear comprises at least one of: material of the upper, patches of the upper, or stitching patterns of the upper.

12. The method of claim 1, further comprising collecting feedback data from a plurality of users, which are provided with at least one sensor attached to the individualized footwear.

13. The method of claim 1, wherein the individualized footwear is a sports shoe comprising a soccer shoe.

14. A system for providing an individualized footwear for a user, the system comprising:
  a processor; and
  a non-transitory computer-readable medium including program code that is executable by the processor for causing the processor to perform operations including:
    obtaining a value for a type of input data relating to the user;
    determining that the type of input data corresponds to at least two attributes of the individualized footwear;
    calculating a parameter for each attribute of the at least two attributes using the value and a respective weight assigned to the type of input data in relation to the attribute, wherein the type of input data is assigned different weights with respect to the at least two attributes, such that the type of input data influences a first parameter for a first attribute more than a second parameter for a second attribute; and
    providing individualized construction data for manufacture of the individualized footwear based on the calculated parameters of the at least two attributes.

15. The system of claim 14, wherein the type of input data comprise anthropometric data of the user, biomechanical data of the user, and personal preference of the user for a footwear.

16. The system of claim 15, wherein the anthropometric data of the user comprises body mass of the user and foot length, ball width, ball angle, ball circumference, waist circumference, instep circumference, heel circumference, heel shape, arch index, and midfoot width of the foot of the user.

17. The system of claim 14, wherein the value is obtained by a 3D foot scan, pressure plate and/or treadmill analysis, force plate analysis, lateral jump analysis, sprint analysis, and/or questionnaire.

18. The system of claim 14, wherein the individualized construction data comprises construction data for manufacture of a last and/or a sole and/or an upper of the individualized footwear.

19. The system of claim 14, wherein the program code is further executable by the processor for causing the processor to select a footwear model from a footwear database based on the calculated parameters of the attributes.

20. A non-transitory computer-readable medium comprising program code that is executable by a processor for causing the processor to perform one or more operations including:
  obtaining a value for a type of input data relating to a user;
  determining that the type of input data corresponds to at least two attributes of an individualized footwear for the user;
  calculating a parameter for each attribute of the at least two attributes using the value and a respective weight assigned to the type of input data in relation to the attribute, wherein the type of input data is assigned different weights with respect to the at least two attributes, such that the type of input data influences a first parameter for a first attribute more than a second parameter for a second attribute; and
  providing individualized construction data for manufacture of the individualized footwear based on the calculated parameters of the at least two attributes.

21. The non-transitory computer-readable medium of claim 20, further comprising program code that is executable by the processor for causing the processor to perform additional operations including, for each attribute of the attributes:
  determining respective weighting factors to apply to multiple types of input data allocated to the attribute, the respective weighting factors being different from one another; and
  applying the respective weighting factor to each type of input data allocated to the attribute to calculate the parameter of the attribute.

* * * * *